(12) United States Patent
Clark et al.

(10) Patent No.: US 10,283,369 B2
(45) Date of Patent: May 7, 2019

(54) ATOMIC LAYER ETCHING USING A BORON-CONTAINING GAS AND HYDROGEN FLUORIDE GAS

(71) Applicant: Tokyo Electron Limited, Minato-ku, Tokyo (JP)

(72) Inventors: Robert D. Clark, Livermore, CA (US); Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/671,404

(22) Filed: Aug. 8, 2017

(65) Prior Publication Data

US 2018/0047577 A1 Feb. 15, 2018

Related U.S. Application Data

(60) Provisional application No. 62/373,232, filed on Aug. 10, 2016.

(51) Int. Cl.
*H01L 21/311* (2006.01)
*C01B 7/19* (2006.01)
*C01B 35/02* (2006.01)
*C01B 35/06* (2006.01)

(52) U.S. Cl.
CPC .. *H01L 21/31116* (2013.01); *H01L 21/31122* (2013.01); *C01B 7/191* (2013.01); *C01B 35/02* (2013.01); *C01B 35/06* (2013.01); *H01L 21/31138* (2013.01)

(58) Field of Classification Search
CPC ......... C01B 35/02; C01B 35/06; C01B 7/191; H01L 21/31116; H01L 21/31055; H01L 21/31138; H01L 21/31122; H01L 21/3065
USPC ....... 438/706, 710, 712, 714, 723, 736, 778, 438/719
See application file for complete search history.

(56) References Cited

U.S. PATENT DOCUMENTS

| 5,041,362 A * | 8/1991 | Douglas ................ G03F 7/265 430/313 |
| 2005/0164479 A1* | 7/2005 | Perng ................ H01L 21/28194 438/591 |
| 2014/0179106 A1* | 6/2014 | Zhong ............... H01L 21/02063 438/689 |
| 2015/0270140 A1* | 9/2015 | Gupta ............... H01L 21/32136 216/67 |
| 2016/0379870 A1* | 12/2016 | Clark ............... H01L 21/76814 438/694 |

\* cited by examiner

*Primary Examiner* — Lan Vinh

(57) ABSTRACT

Embodiments of the invention provide a method for atomic layer etching (ALE) of a substrate. According to one embodiment, the method includes providing a substrate, and exposing the substrate to hydrogen fluoride (HF) gas and a boron-containing gas to etch the substrate. According to another embodiment, the method includes providing a substrate containing a metal oxide film, exposing the substrate to HF gas to form a fluorinated surface layer on the metal oxide film, and exposing the substrate to a boron-containing gas to remove the fluorinated surface layer from the metal oxide film. The exposures may be repeated at least once to further etch the metal oxide film.

12 Claims, 8 Drawing Sheets

1st Half Reaction:    $Al_2O_3 + 6HF \longrightarrow 2AlF_3 + 3H_2O$

2nd Half Reaction:    $AlF_3 + BH_3 \longrightarrow BF_3 + AlH_3$

Overall Reaction:  $Al_2O_3 + 6HF + 2BH_3 \longrightarrow 2BF_3 + 2AlH_3 + 3H_2O$ 1st Half Reaction: $Al_2O_3 + 6HF \rightarrow 2AlF_3 + 3H_2O$ 2nd Half Reaction: $AlF_3 + BL_3 \rightarrow BF_3 + AlL_3$ Overall Reaction: $Al_2O_3 + 6HF + 2BL_3 \rightarrow 2BF_3 + 2AlL_3 + 3H_2O$

ATOMIC LAYER ETCHING USING A BORON-CONTAINING GAS AND HYDROGEN FLUORIDE GAS

CROSS-REFERENCE TO RELATED APPLICATIONS

This application is related to and claims priority to U.S. Provisional Patent Application Ser. No. 62/373,232 filed on Aug. 10, 2016, the entire contents of which are herein incorporated by reference.

FIELD OF INVENTION

The present invention relates to the field of semiconductor manufacturing and semiconductor devices, and more particularly, to atomic layer etching (ALE) of a substrate using a boron-containing gas and hydrogen fluoride (HF) gas.

BACKGROUND OF THE INVENTION

As device feature size continues to scale it is becoming a significant challenge to accurately control etching of fine features. For highly scaled nodes 10 nm and below, devices require atomic scaled fidelity or very tight process variability. There is significant impact on device performance due to variability. In this regards, self-limiting and atomic scale processing methods such as ALE are becoming a necessity.

SUMMARY OF THE INVENTION

A method is provided for ALE of a substrate. According to one embodiment, the method includes providing a substrate, and exposing the substrate to HF gas and a boron-containing gas to etch the substrate.

According to another embodiment, the method includes providing a substrate containing a metal oxide film, exposing the substrate to HF gas to form a fluorinated surface layer on the metal oxide film, and exposing the substrate to a boron-containing gas to remove the fluorinated surface layer from the metal oxide film. The exposures may be repeated at least once to further etch the metal oxide film.

According to yet another embodiment, the method includes providing a substrate containing a metal oxide film having a first fluorinated surface layer, exposing the substrate to a first boron-containing gas to remove the first fluorinated surface layer from the metal oxide film, exposing the substrate to HF gas to form a second fluorinated surface layer on the metal oxide film, and exposing the substrate to a second boron-containing gas to remove the second fluorinated surface layer from the metal oxide film. The exposures to the HF gas and the second boron-containing gas may be repeated at least once to further etch the metal oxide film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Developing advanced technology for advanced semiconductor technology nodes presents an unprecedented challenge for manufacturers of semiconductor devices, where these devices will require atomic-scale manufacturing control of etch variability. ALE is viewed by the semiconductor industry as an alternative to conventional continuous etching. ALE is a substrate processing technique that removes thin layers of material using sequential self-limiting reactions and is considered one of the most promising techniques for achieving the required control of etch variability necessary in the atomic-scale era.

ALE is often defined as a film etching technique that uses sequential self-limiting reactions. The concept is analogous to atomic layer deposition (ALD), except that removal occurs in place of a second adsorption step, resulting in layer-by-layer material removal instead of addition. The simplest ALE implementation consists of two sequential steps: surface modification (1) and removal (2). Surface modification forms a thin reactive surface layer with a well-defined thickness that is subsequently more easily removed than the unmodified material. The thin reactive surface layer is characterized by a sharp gradient in chemical composition and/or physical structure of the outermost layer of a material. The removal step takes away at least a portion of the thin reactive surface layer while keeping the underlying substrate intact, thus "resetting" the surface to a suitable state for the next etching cycle. The total amount of material removed is determined by the number of repeated cycles.

Figure 1:
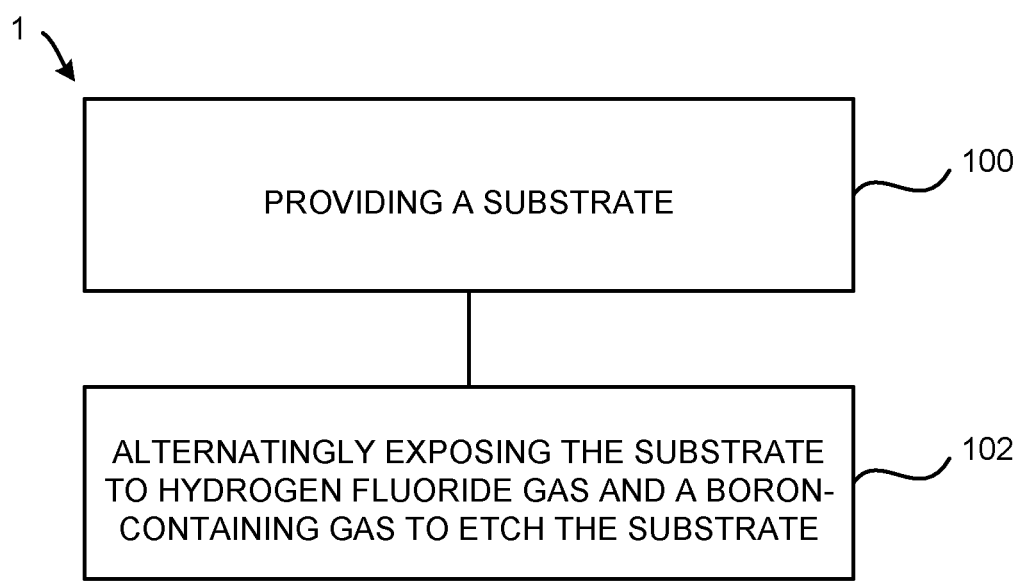
FIG. 1 is a process flow diagram for processing a substrate according to an embodiment of the invention.

Embodiments of the invention provide a method for manufacturing of semiconductor devices, and more particularly, to ALE using HF gas and a boron-containing gas. FIG. 1 is a process flow diagram for processing a substrate according to an embodiment of the invention. The process flow 1 includes, in 100, providing a substrate, and in 102, exposing the substrate to HF gas and a boron-containing gas to etch the substrate. The exposures may be alternating or may have some temporal overlap and may be repeated at least once to further etch the substrate. The boron-containing gas can contain a boron hydride, a boron halide, a boron amide, an organo boride, or a combination thereof. The boron-containing gas may be selected from the group consisting of $BH_3$, $BCl_3$, $B(CH_3)_3$, and $B(N(CH_3)_2)_3$. According to one embodiment, the substrate contains a metal oxide film that is etched by the gas exposures. The metal oxide film may be selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, $ZnO$, $MgO$, $CaO$, $BeO$, $V_2O_5$, $FeO$, $FeO_2$, $CrO$, $Cr_2O_3$, $CrO_2$, $MnO$, $Mn_2O_3$, $RuO$, $CoO$, $WO_3$, and combinations thereof.

Figure 2:
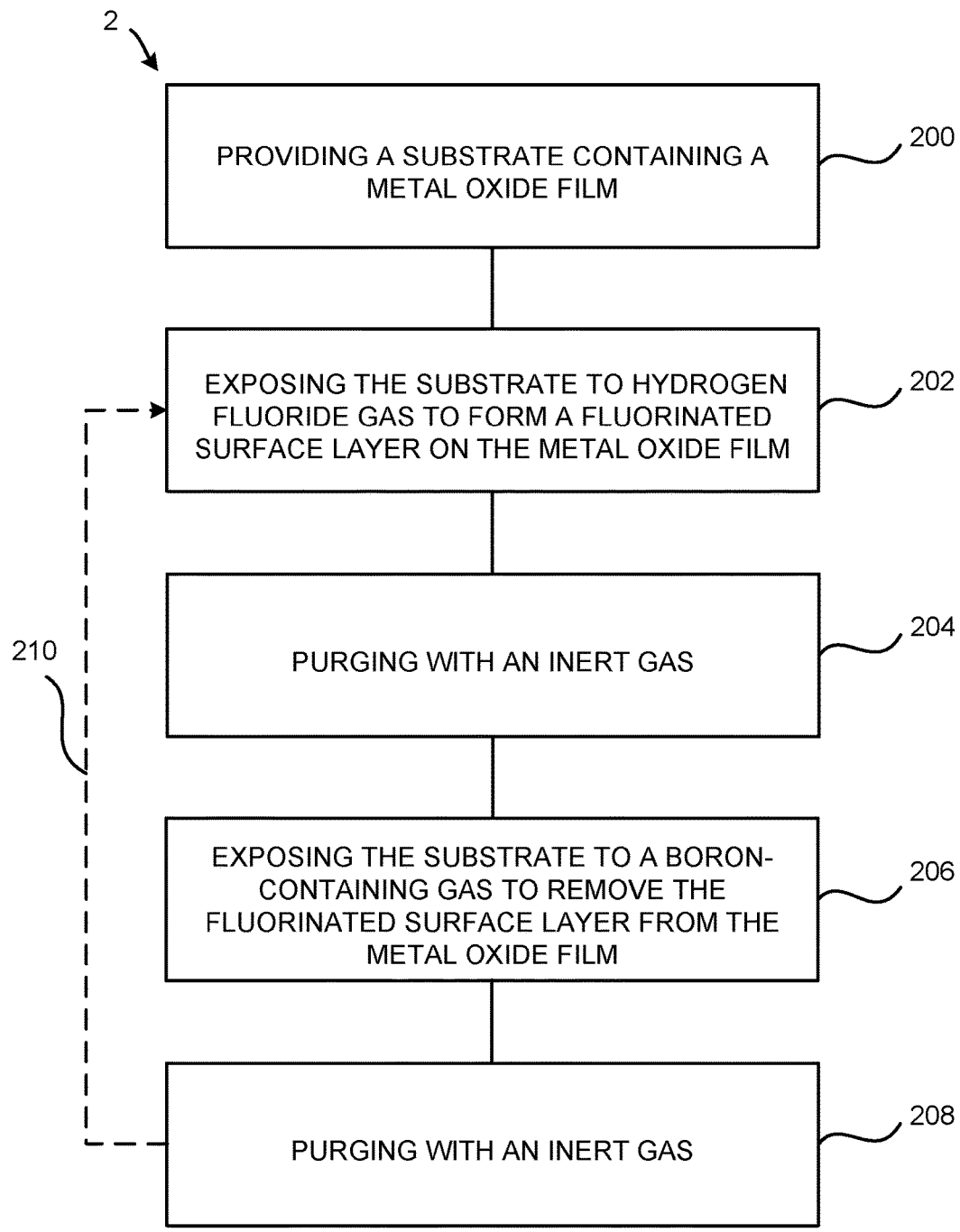
FIG. 2 is a process flow diagram for processing a substrate according to an embodiment of the invention.
Figure 3A:
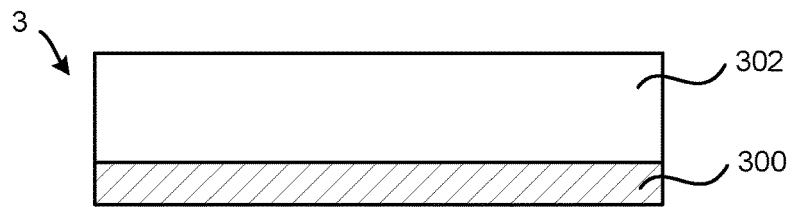
FIGS. 3A-3D schematically show through cross-sectional views a method of processing a substrate according to an embodiment of the invention.
Figure 3B:
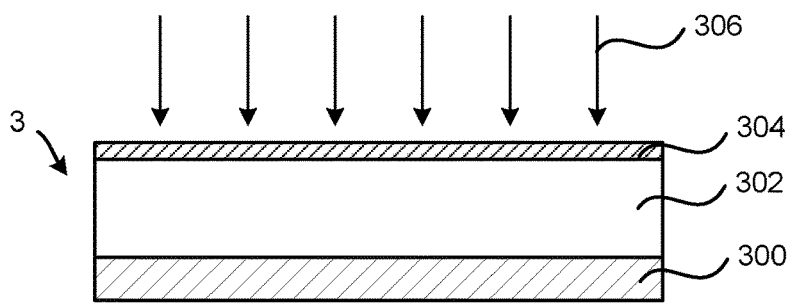
Figure 3C:
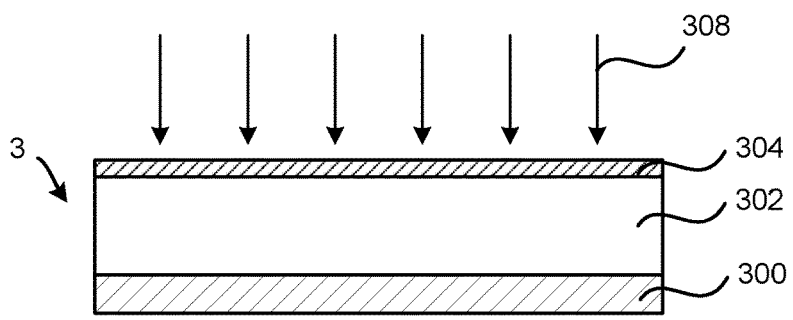
Figure 3D:
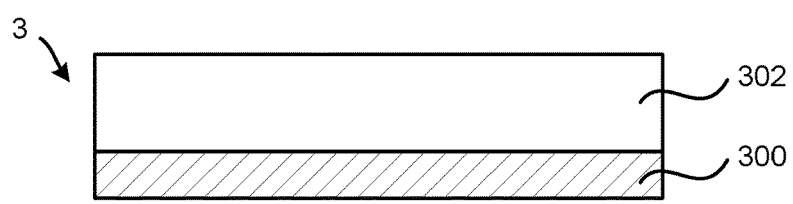

FIG. 2 is a process flow diagram for processing a substrate according to an embodiment of the invention. Referring also to FIGS. 3A-3D, the process flow 2 includes, in 200, providing a substrate 3 containing a metal oxide film 302 on a layer 300. For example, the metal oxide film 302 may be selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO, $WO_3$, and combinations thereof. In 202, the substrate 3 is exposed to HF gas 306 to form a fluorinated surface layer 304 on the metal oxide film 302. In 204, the substrate 3 may be purged with an inert gas (e.g., argon (Ar) or nitrogen ($N_2$)) to remove excess HF and reaction byproducts. In 206, the substrate 3 is exposed to a boron-containing gas 308 to react with and remove the fluorinated surface layer 304. The reaction byproducts include volatile $BF_3$ species and metal-containing species that desorb from the substrate 3 and are efficiently pumped out of the process chamber. The inventors have discovered that the use of the boron-containing gas 308 in combination with fluorinated surface species advantageously allows for low-temperature thermal ALE in the absence of a plasma. The boron-containing gas 308 can contain a boron hydride, a boron halide, a boron amide, an organo boride, or a combination thereof. The boron-containing gas 308 may be selected from the group consisting of $BH_3$, $BCl_3$, $B(CH_3)_3$, and $B(N(CH_3)_2)_3$. In 208, the substrate 3 may be purged with an inert gas to remove excess boron-containing gas and reaction byproducts. As shown by process arrow 210, the alternating exposures 202-208 may be repeated at least once to further etch the metal oxide film 302. The alternating exposures 202-208 constitute one ALE cycle.

Figure 4:
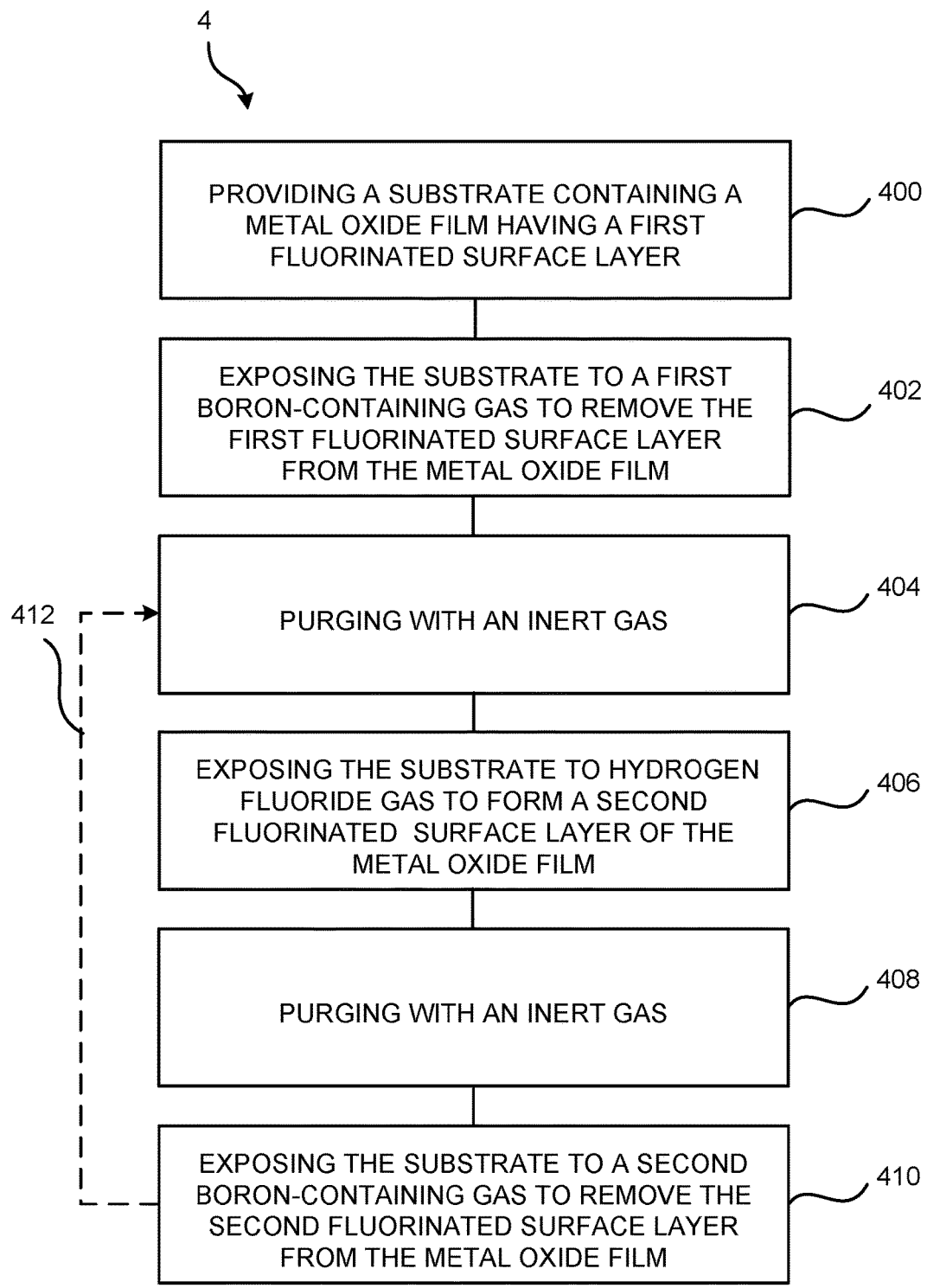
FIG. 4 is a process flow diagram for processing a substrate according to an embodiment of the invention.
Figure 5A:
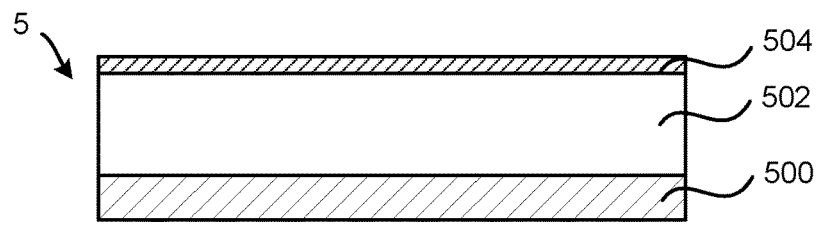
FIGS. 5A-5F schematically show through cross-sectional views a method of processing a substrate according to an embodiment of the invention.
Figure 5B:
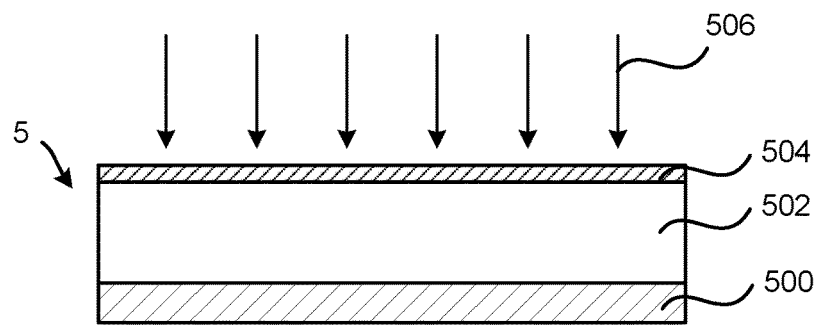
Figure 5C:
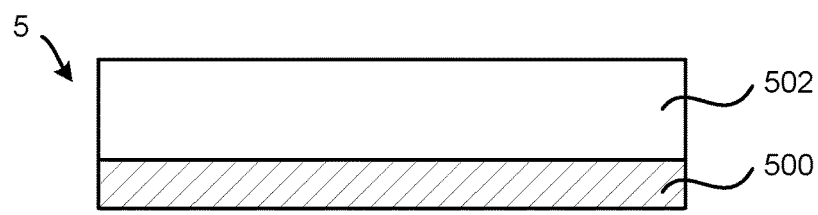
Figure 5D:
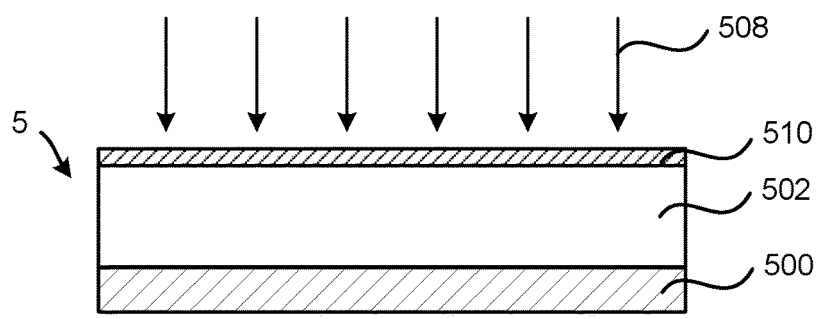
Figure 5E:
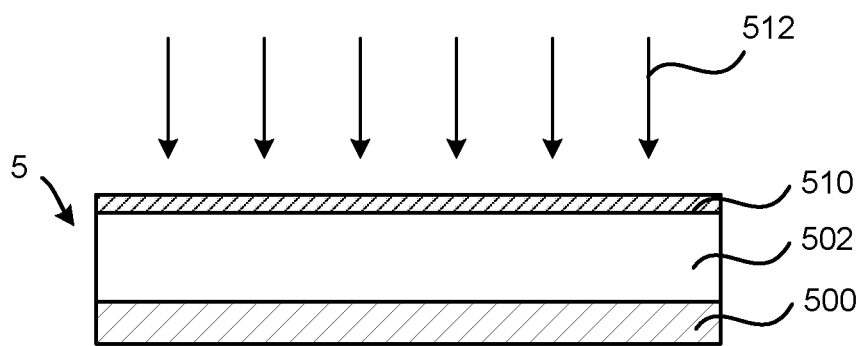
Figure 5F:
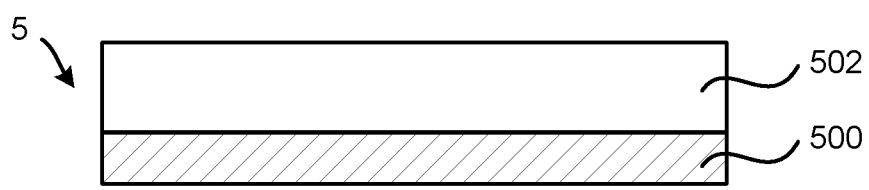

FIG. 4 is a process flow diagram for processing a substrate according to an embodiment of the invention. Referring also to FIGS. 5A-5F, the process flow 4 includes, in 400, providing a substrate 5 containing a metal oxide film 502 having a first fluorinated surface layer 504. For example, the metal oxide film 502 may be selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO, $WO_3$, and combinations thereof. The first fluorinated surface layer 504 may be formed by wet processing (e.g., using aqueous HF) or by dry processing (e.g., using HF gas). In one example, the first fluorinated surface layer 504 may be formed by an etching process that utilizes an organic fluorine-containing etching gas. In 402, the substrate 5 is exposed to a first boron-containing gas 506 to remove the first fluorinated surface layer 504 from the metal oxide film 502. In 404, the substrate 5 may be purged with an inert gas to remove excess first boron-containing gas and reaction byproducts. In 406, the substrate 5 is exposed to HF gas 508 to form a second fluorinated surface layer 510 on the metal oxide film 502. In 408, the substrate 5 may be purged with an inert gas to remove excess HF gas and reaction byproducts. In 410, the substrate 5 is exposed to a second boron-containing gas 512 to remove the second fluorinated surface layer 510 from the metal oxide film 502.

The first and second boron-containing gases 506 and 512 can contain a boron hydride, a boron halide, a boron amide, an organo boride, or a combination thereof. The first and second boron-containing gases 506 and 512 may independently be selected from the group consisting of $BH_3$, $BCl_3$, $B(CH_3)_3$, and $B(N(CH_3)_2)_3$. As shown by process arrow 412, the exposures 404-410 may be repeated at least once to further etch the metal oxide film 502.

Figure 6:
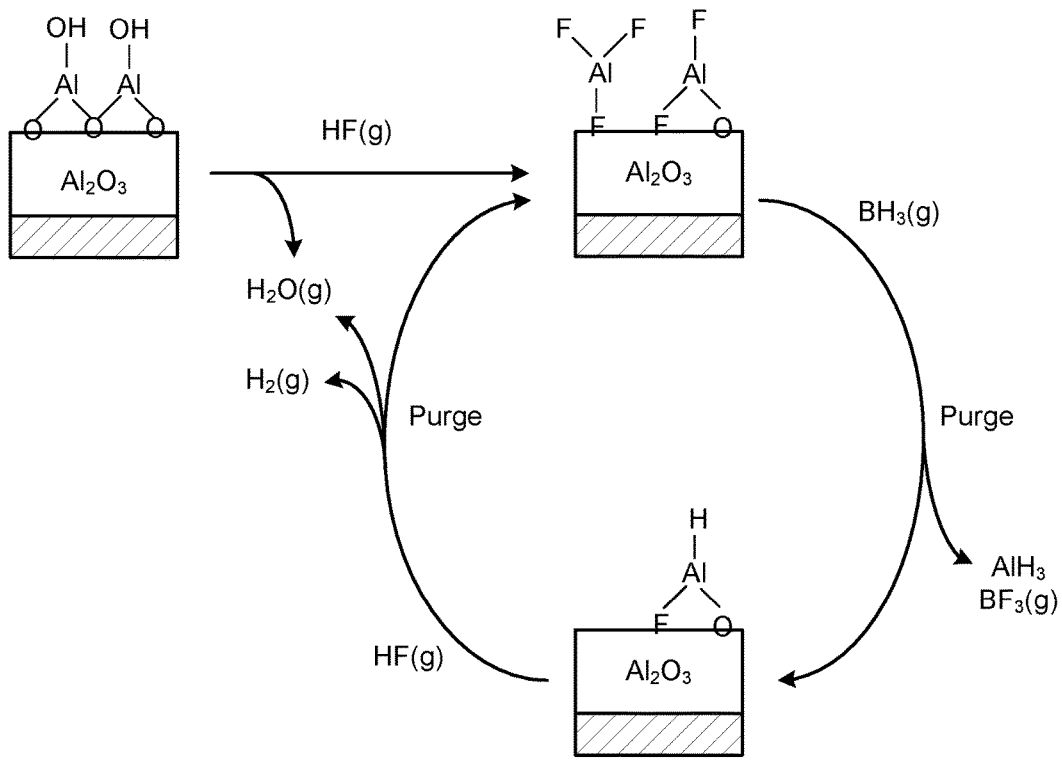
FIG. 6 is a process flow diagram for processing a substrate according to an embodiment of the invention.

FIG. 6 is a process flow diagram for processing a substrate according to an embodiment of the invention. The process flow illustrates the half reactions and the overall reaction for exemplary ALE of $Al_2O_3$ using alternating exposures of HF gas and $BH_3$ gas. The reaction byproducts include volatile $BF_3$ species, $AlH_3$ species and $H_2O$ species that desorb from the substrate and are efficiently pumped out of the process chamber.

Figure 7:
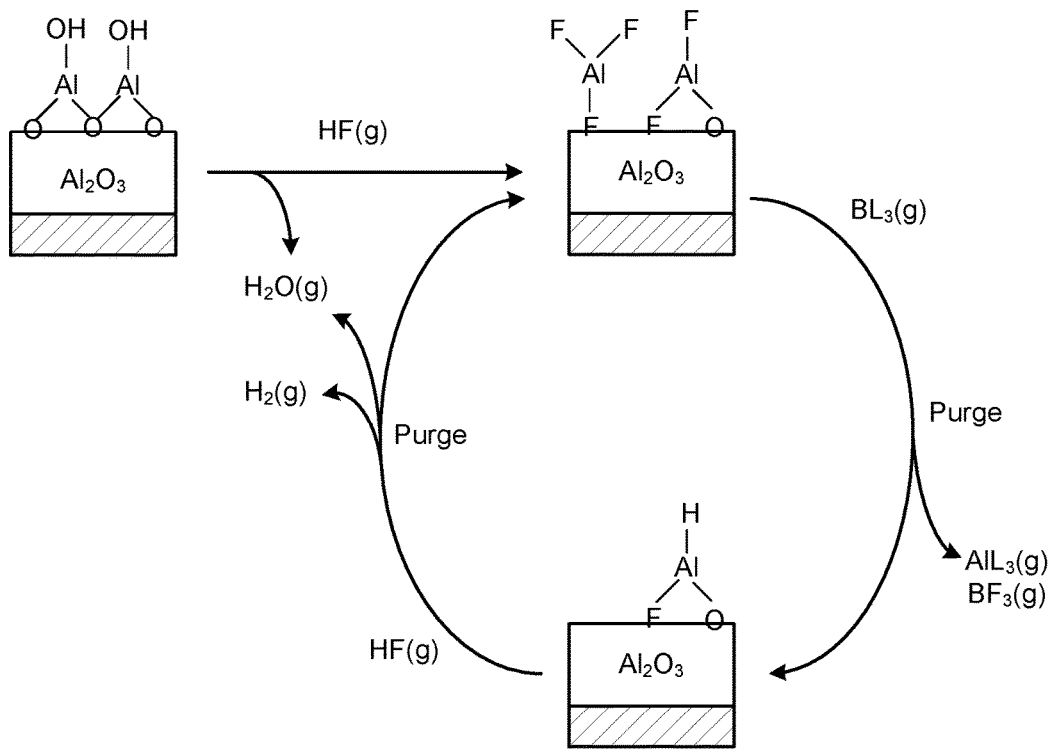
FIG. 7 is a process flow diagram for processing a substrate according to an embodiment of the invention.

FIG. 7 is a process flow diagram for processing a substrate according to an embodiment of the invention. The process flow illustrates the half reactions and the overall reaction for exemplary ALE of $Al_2O_3$ using alternating exposures of HF gas and $BL_3$ gas, where L can include hydrogen, a halogen, an amide, or an organic group. Examples of $BL_3$ include $BH_3$, $BCl_3$, $B(CH_3)_3$, and $B(N(CH_3)_2)_3$. The reaction byproducts include volatile $BF_3$ species, $AlL_3$ species and $H_2O$ species that desorb from the substrate and are efficiently pumped out of the process chamber.

A plurality of embodiments for atomic layer etching using a boron-containing gas and HF gas have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of atomic layer etching (ALE), the method comprising:
   providing a substrate containing a metal oxide film having a first fluorinated surface layer;
   exposing the substrate to a first boron-containing gas to remove the first fluorinated surface layer from the metal oxide film;
   exposing the substrate to hydrogen fluoride (HF) gas to form a second fluorinated surface layer on the metal oxide film; and
   exposing the substrate to a second boron-containing gas to remove the second fluorinated surface layer from the metal oxide film.

2. The method of claim 1, wherein the exposures to the HF gas and the second boron-containing gas are repeated at least once to further etch the metal oxide film.

3. The method of claim 1, wherein the metal oxide film is selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO, $WO_3$, and combinations thereof.

4. The method of claim 1, wherein the metal oxide film is formed by oxidizing a metal layer.

5. The method of claim 1, further comprising gas purging with an inert gas between the exposing steps.

6. The method of claim 1, wherein the first fluorinated surface layer is formed using wet processing with aqueous HF.

7. The method of claim 1, wherein the first and second boron-containing gases contain a boron hydride, a boron halide, a boron amide, an organo boride, or a combination thereof.

8. The method of claim 7, wherein the first and second boron-containing gases are selected from the group consisting of $BH_3$, $BCl_3$, $B(CH_3)_3$, and $B(N(CH_3)_2)_3$.

9. The method of claim 1, wherein the first fluorinated surface layer is formed by dry processing.

10. The method of claim 9, wherein the dry processing includes HF gas or an organic fluorine-containing etching gas.

11. The method of claim 1, wherein the first and second boron-containing gases contain a boron hydride, a boron amide, an organo boride, or a combination thereof.

12. The method of claim 11, wherein the first and second boron-containing gases are selected from the group consisting of $BH_3$, $B(CH_3)_3$, and $B(N(CH_3)_2)_3$.

* * * * *